(12) United States Patent
Shao

(10) Patent No.: US 9,363,923 B2
(45) Date of Patent: Jun. 7, 2016

(54) DEFLECTION DEVICE AND ELECTRONIC DEVICE HAVING THE SAME

(71) Applicant: Wistron Corporation, New Taipei (TW)

(72) Inventor: Chia-Chi Shao, New Taipei (TW)

(73) Assignee: Wistron Corporation, New Taipei (TW)

( * ) Notice: Subject to any disclaimer, the term of this patent is extended or adjusted under 35 U.S.C. 154(b) by 192 days.

(21) Appl. No.: 14/156,281

(22) Filed: Jan. 15, 2014

(65) Prior Publication Data

US 2015/0029659 A1   Jan. 29, 2015

(30) Foreign Application Priority Data

Jul. 29, 2013   (TW) .............................. 102127138 A

(51) Int. Cl.
 *G06F 1/20*  (2006.01)
 *H05K 7/20*  (2006.01)

(52) U.S. Cl.
 CPC .............. *H05K 7/20145* (2013.01); *G06F 1/20* (2013.01)

(58) Field of Classification Search
 CPC ... H05K 7/20; H05K 7/2049; H05K 7/20445; G06F 1/20
 USPC .......................................... 361/679.5, 679.51
 See application file for complete search history.

(56) References Cited

U.S. PATENT DOCUMENTS

| | | | | |
|---|---|---|---|---|
| 6,155,920 A * | 12/2000 | Pan | ........................... | G06F 1/20 361/695 |
| 7,204,750 B2 * | 4/2007 | Shen | ........................ | G06F 1/20 165/80.3 |
| 8,009,417 B2 * | 8/2011 | Searby | ..................... | G06F 1/20 165/104.33 |
| 8,353,746 B2 * | 1/2013 | Tsai | ........................ | G06F 1/185 454/284 |
| 2005/0047084 A1 * | 3/2005 | Kabat | ................ | H05K 7/20563 361/690 |
| 2008/0101011 A1 * | 5/2008 | Carr | ........................... | G06F 1/20 361/679.31 |
| 2008/0117589 A1 * | 5/2008 | Carrera | ..................... | G06F 1/20 361/679.51 |
| 2009/0233537 A1 * | 9/2009 | Kao | ................... | H05K 7/20454 454/184 |
| 2010/0020487 A1 * | 1/2010 | Lee | ......................... | G06F 1/185 361/679.49 |
| 2010/0097758 A1 * | 4/2010 | Franz | ................. | H05K 7/20145 361/694 |
| 2010/0165568 A1 * | 7/2010 | Tsai | ........................ | G06F 1/20 361/679.49 |
| 2011/0051358 A1 * | 3/2011 | Searby | ....................... | G06F 1/20 361/679.48 |
| 2012/0133473 A1 * | 5/2012 | Shih | ...................... | H01F 27/292 336/200 |
| 2012/0320523 A1 * | 12/2012 | Murakami | ................ | G06F 1/20 361/679.54 |

(Continued)

FOREIGN PATENT DOCUMENTS

TW   M348471   1/2009
TW   M356162   5/2009

*Primary Examiner* — Anthony Haughton
*Assistant Examiner* — Matt Dhillon
(74) *Attorney, Agent, or Firm* — Muncy, Geissler, Olds & Lowe, P.C.

(57) ABSTRACT

A deflection device and an electronic device are disclosed. The deflection device is located in the electronic device for guiding airflow generated by a fan device to at least one electronic component. The deflection device includes a first fixed part and a plurality of strip structures. The first fixed part is used for fixing the deflection device in a suitable position. One end of each of the strip structures is connected to the first fixed part and able to undergo compression deformation independently such that forms a first shape when not compressed or a second shape when compressed. When the deflection device is fixed in a suitable position of the electronic device and close to the electronic component, the shape of the at least one strip structure is changed from a first shape to a second shape for guiding the airflow to the electronic component.

22 Claims, 7 Drawing Sheets

(56) References Cited

U.S. PATENT DOCUMENTS

| | | | | |
|---|---|---|---|---|
| 2013/0163191 A1* | 6/2013 | Chen | ............... | G06F 1/20 361/679.46 |
| 2013/0342993 A1* | 12/2013 | Singleton | ............ | H05K 7/20836 361/690 |
| 2014/0334093 A1* | 11/2014 | Wei | ............... | G06F 1/20 361/679.47 |

* cited by examiner

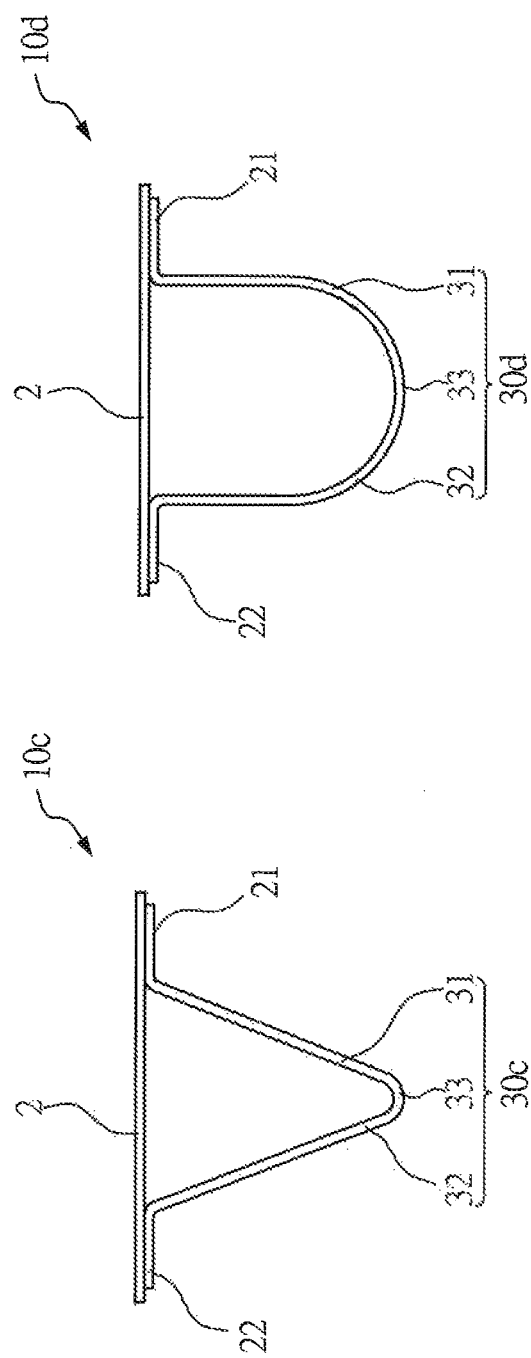

DEFLECTION DEVICE AND ELECTRONIC DEVICE HAVING THE SAME

BACKGROUND OF THE INVENTION

1. Field of the Invention

The present invention relates to an electronic device with a deflection device; more particularly, the present invention relates to an electronic device with a deflection device, wherein the deflection device is used for coordinating with interface cards of different sizes.

2. Description of the Related Art

As technology develops, computer systems are also increasingly powerful, but at the same time, the heat generated by a computer system also increases. In a computer system, in addition to the central processor, the memory or the hard disk drive, the interface card installed on the motherboard can also generate heat during high-speed operation. In order to smoothly dissipate the heat generated by the interface card, a wind scoop is provided in the prior art to directly guide the airflow generated by the fan device to the interface card. But different interface cards are of different heights; therefore, a wind scoop with a rigid shape cannot meet the requirements of interface cards of different heights. If the manufacturer redesigns the size of the wind scoop according to different interface cards, the design and production costs will be prohibitively high.

Therefore, there is a need to provide a deflection device to solve the disadvantage of the prior art.

SUMMARY OF THE INVENTION

It is an object of the present invention to provide a deflection device for coordinating with the interface cards of different sizes.

It is another object of the present invention to provide an electronic device with the abovementioned deflection device.

To achieve the abovementioned object, the deflection device of the present invention is located in the electronic device for guiding an airflow generated by a fan device to at least one electronic component of the electronic device. The deflection device includes a first fixed part and a plurality of strip structures. The first fixed part is used for fixing the deflection device in a suitable position within the electronic device. One end of each strip structure is connected to the first fixed part, and at least one part of any two adjacent strip structures is not connected to each other, allowing each strip structure to undergo compression deformation independently such that it forms a first shape when not pressed or a second shape when pressed; when the deflection device is fixed in a suitable position of the electronic device and close to the electronic component, the shape of the at least one strip structure is changed from the first shape to the second shape due to contacting the electronic component for guiding the airflow to the electronic component.

The electronic device of the present invention includes a fan device, at least one electronic component, and a deflection device. The fan device is used for generating the airflow. The deflection device is used for guiding the airflow of the fan device to the at least one electronic component. The deflection device includes a first fixed part and a plurality of strip structures. The first fixed part is used for fastening the deflection device in a suitable position within the electronic device. One end of each strip structure is connected to the first fixed part, and at least one part of any two adjacent strip structures is not connected to each other, allowing each strip structure to undergo compression deformation independently such that it forms a first shape when not compressed or a second shape when compressed. When the deflection device is fixed in a suitable position of the electronic device and close to the electronic component, the shape of the at least one strip structure is changed from the first shape to the second shape due to contacting the electronic component for guiding the airflow to the electronic component.

BRIEF DESCRIPTION OF THE DRAWINGS

FIG. 6 illustrates a lateral view of the deflection device in the fourth embodiment of the present invention.

FIG. 7 illustrates a lateral view of the deflection device in the fifth embodiment of the present invention,

DETAILED DESCRIPTION OF THE PREFERRED EMBODIMENT

These and other objects and advantages of the present invention will become apparent from the following description of the accompanying drawings, which disclose several embodiments of the present invention. It is to be understood that the drawings are to be used for purposes of illustration only, and not as a definition of the invention.

Figure 1:
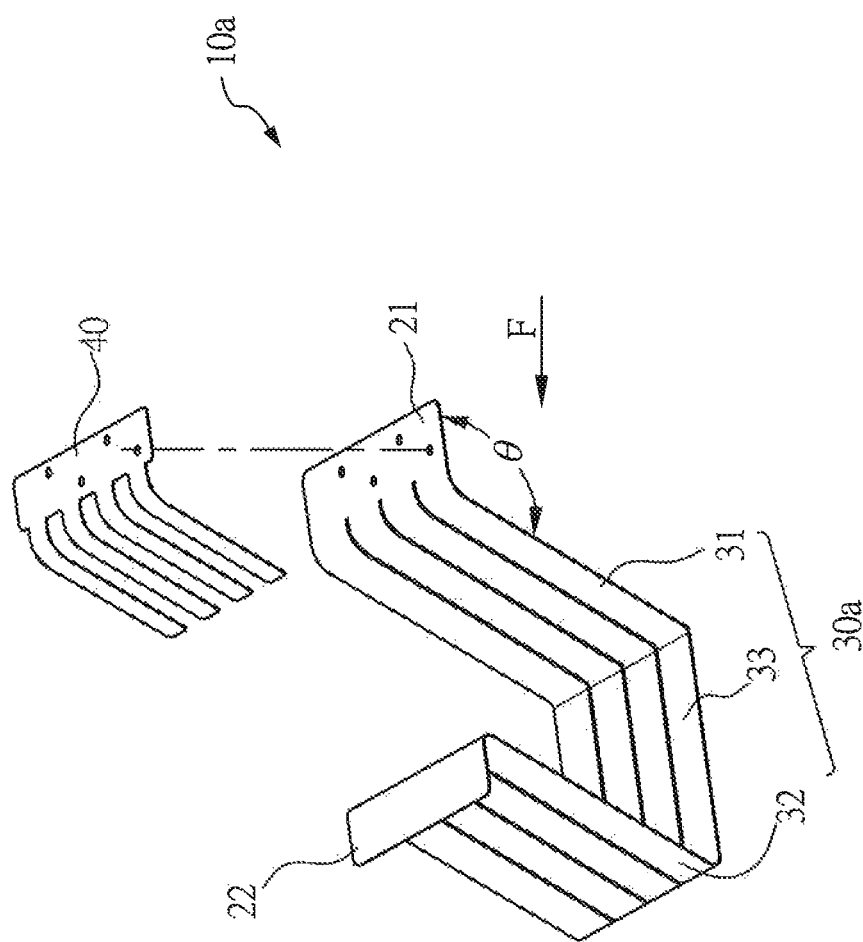
FIG. 1 illustrates a schematic drawing of the deflection device in the first embodiment of the present invention.

Please refer to FIG. 1, which illustrates a schematic drawing of the deflection device in the first embodiment of the present invention. The deflection device of the present invention is applied to an electronic device, such as a desktop computer, but the present invention is not limited to that application.

Figure 2:
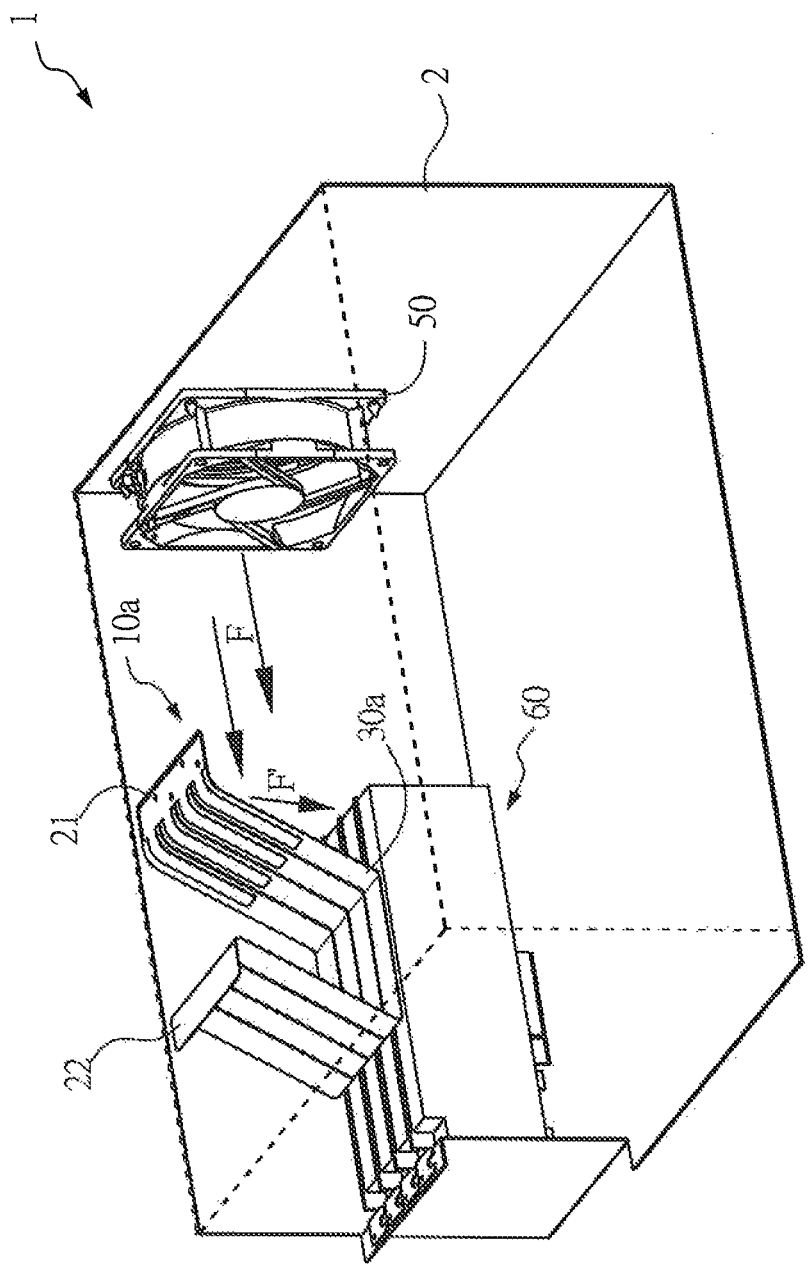
FIG. 2 illustrates a schematic drawing of the deflection device applied to the computer device in the first embodiment of the present invention.
Figure 4A:
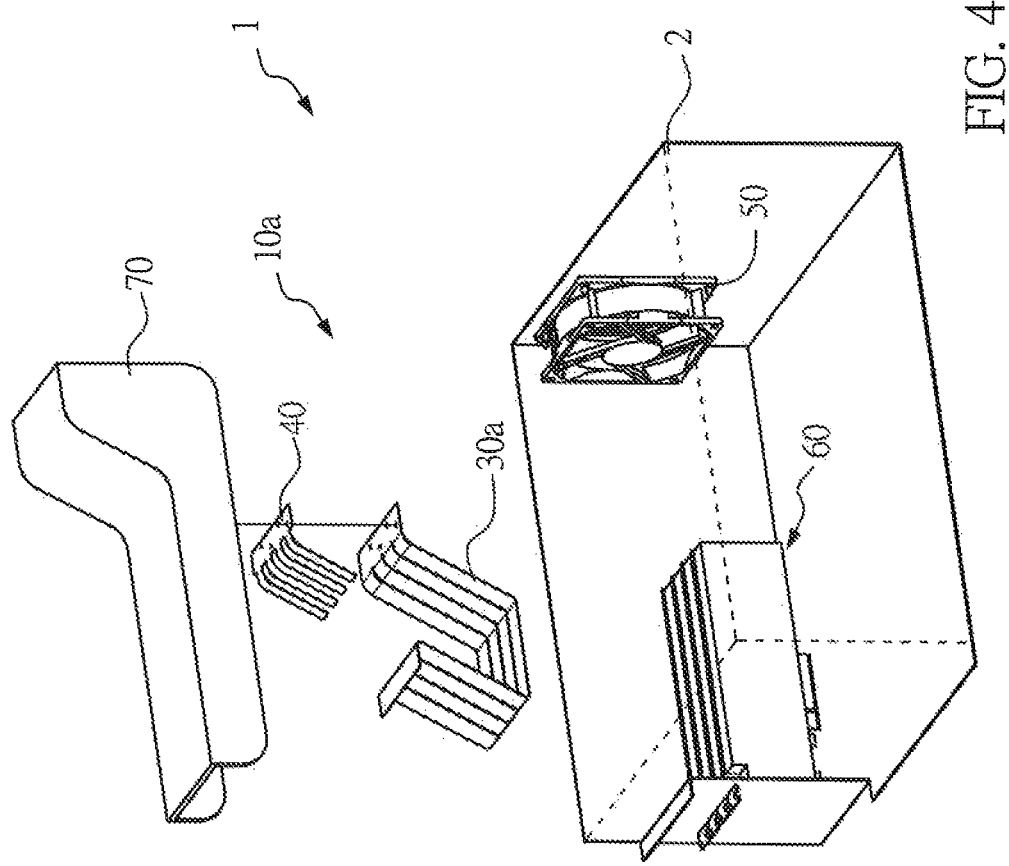
FIG. 4A-4B illustrate schematic drawings of the deflection device applied to the computer device in the second embodiment of the present invention.

In the first embodiment of the present invention, the deflection device 10*a* includes a first fixed part 21, a second fixed part 22, and a plurality of strip structures 30*a*. The first fixed part 21 and the second fixed part 22 are fastened to the internal structure in the electronic device 1, such as fastened to the wall of the case 2 (as shown in FIG. 2) or to the wind scoop 70 (as shown in FIG. 4A). The plurality of strip structures 30*a* can be made of deformable and elastically restored sheet-like material with softness and toughness, such as a polycarbonate film, but the present invention is not limited to that design. The two ends of each strip structure 30*a* are respectively connected to the first fixed part 21 and the second fixed part 22, and any two adjacent strip structures 30*a* are not connected to each other, allowing each strip structure 30*a* to undergo compression deformation independently In the first embodiment, the plurality of strip structures 30*a* can be divided into a first section 31, a second section 32, and a third section 33 according to the shape. One end of the first section 31 is connected to the first fixed part 21. One end of the second section 32 is connected to the second fixed part 22. The two ends of the third section 33 are respectively connected to an end of the first section 31 and an end of the second section 32. The third section 33 is located between the first section 31 and the second section 32.

The first section 31 faces an incoming direction of the airflow F, and a wind angle θ is formed between the first section 31 and the first fixed part 21 along a direction which faces the incoming direction of the airflow F. In the present embodiment, the wind angle θ is larger than 90°, allowing the first section 31 to be a tilted backwards shape relative to the first fixed part 31. In addition, if the strip structure 30a is made of a soft material, such as a polycarbonate film, then a metal spring structure 40 can be additionally fixed on the first section 31 and the first fixed part 21 along the direction which faces the incoming direction of the airflow F to increase the support force and the resilience of the first section 31 and the first fixed part 21. However, in another embodiment, if the strip structure 30a is made of another material with great flexibility and strong support force, the metal spring structure 40 may not be additionally added in the present invention. In addition, in the present embodiment, the second section 31 is substantially parallel to the first section, and the first fixed part 21 and the second fixed part 22 are located on a same virtual plane, allowing the first fixed part 21, the second fixed part 22, the first section 31, the second section 32, and the third section 33 together to form a structure similar to a parallelogram.

Please refer to FIG. 2, which illustrates a schematic drawing of the deflection device applied to the computer device in the first embodiment of the present invention.

The deflection device 10a of the present invention is applied to the electronic device 1. The electronic device 1 can be a computer system, such as a desktop computer, but the present invention is not limited to that application. The electronic device 1 includes a case 2, a fan device 50, an electronic component, and other circuit elements (not shown in the figure). In the first embodiment of the present invention, the electronic component is an interface card 60, but the present invention is not limited to the interface card 60. The deflection device 10a, the fan device 50, and the interface card 60 are all located in the case 2, and the first fixed part 21 and the second fixed part 22 of the deflection device 10a are fastened to the top of the case 2. Therefore, the first section 31, the second section 32, the third section 33, and the case 2 together form a parallelogram. The fan device 50 is used for generating airflow to dissipate the heat generated by the interface card 60. Via the shape formed by the deflection device 10a and the case 2 of the electronic device 1, the incoming direction of the airflow (Inter Flow) F generated by the fan device 50 will be changed to form a guided flow F' that is guided to the at least one interface card 60, such that the heat from the interface card 60 can be dissipated efficiently Please refer to FIG. 3, which illustrates a schematic drawing of the deflection device applied to a different interface card in the first embodiment of the present invention.

Figure 3:
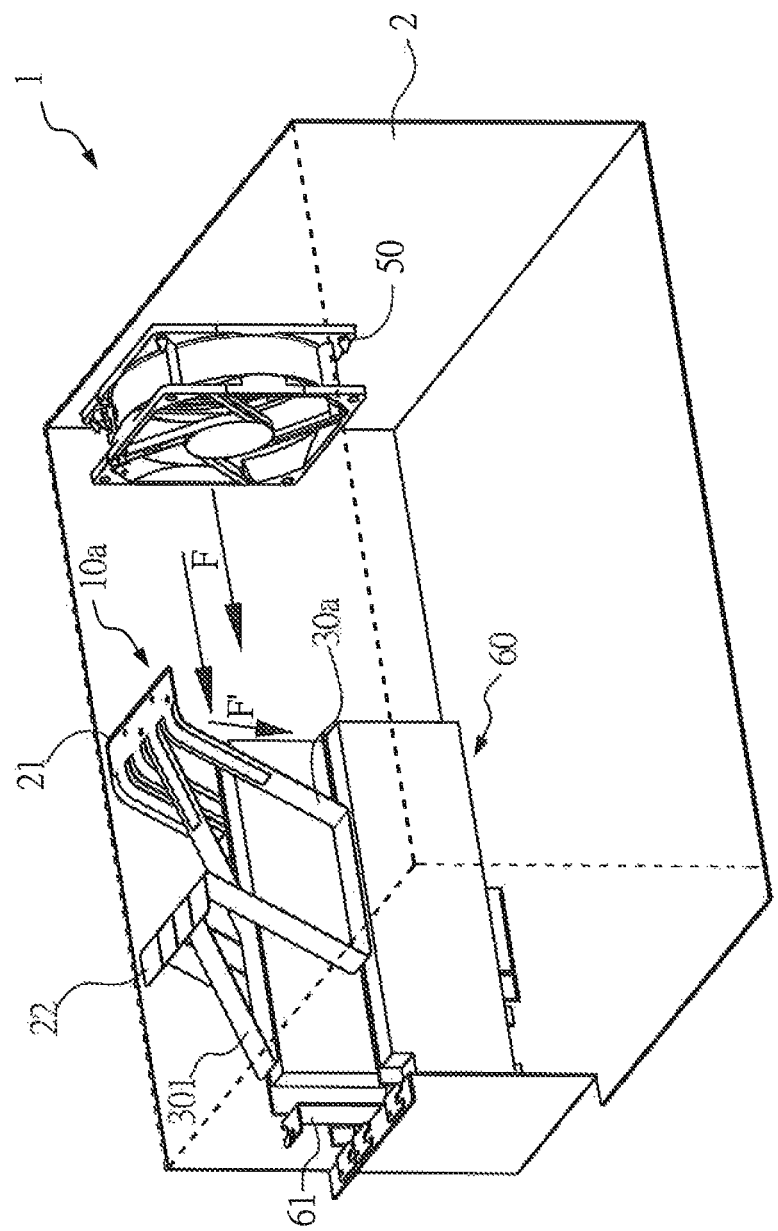
FIG. 3 illustrates a schematic drawing of the deflection device applied to a different interface card in the first embodiment of the present invention.

In the plurality of strip structures 30a, the width of each strip structure 30a corresponds to the width of the interface card 60. Since each strip structure 30a can undergo compression deformation independently, the shape of each strip structure 30a can be flexibly changed according to the assembly height of the coordinating interface card 60. As shown in FIG. 3, when the specific interface card 61 is installed in the electronic device 1, the third section 33 of the corresponding strip structure 301 of the plurality of strip structures 30a will be contacted and pushed upward by the specific interface card 61 such that the shape of the strip structure 301 will be changed based on the height of the specific interface card 61 when installed to form the second shape; i.e., the height of the third section 33 of the corresponding strip structure 301 will be changed, but the change will not affect the shape or height of other strip structures 30a. The specific interface card 61 can be an interface card with a large size, but if the specific interface card 61 is an interface card with a small size, the shape of the corresponding strip structure 301 can also be adjusted. Therefore, the shape of the strip structure 30a can be changed automatically when the strip structure 30a is in contact with interface cards 60 of different specifications. In addition, when the specific interface card 61 is removed from the electronic device 1, the corresponding strip structure 301 can return to its original first shape due to the structure of the strip structure 301 or the elasticity of the metal spring structure 40.

According to the abovementioned description, each strip structure 30a of the deflection device 10a can coordinate with the height of the corresponding electronic component installed under the strip structure 30a to correspondingly and elastically change in shape; also, the strip structure 30a may lie flat against the top of the case 2 so as not to occupy the internal space of the case 2. It is to be known that the second fixed part 22 of the deflection device 10a does not need to be fastened to the case 2, nor does the deflection device 10a need to have the second fixed part 22; due to the feature of the material of the strip structure 30a, the desired deformation and elastic restoring force can be achieved.

Figure 4B:
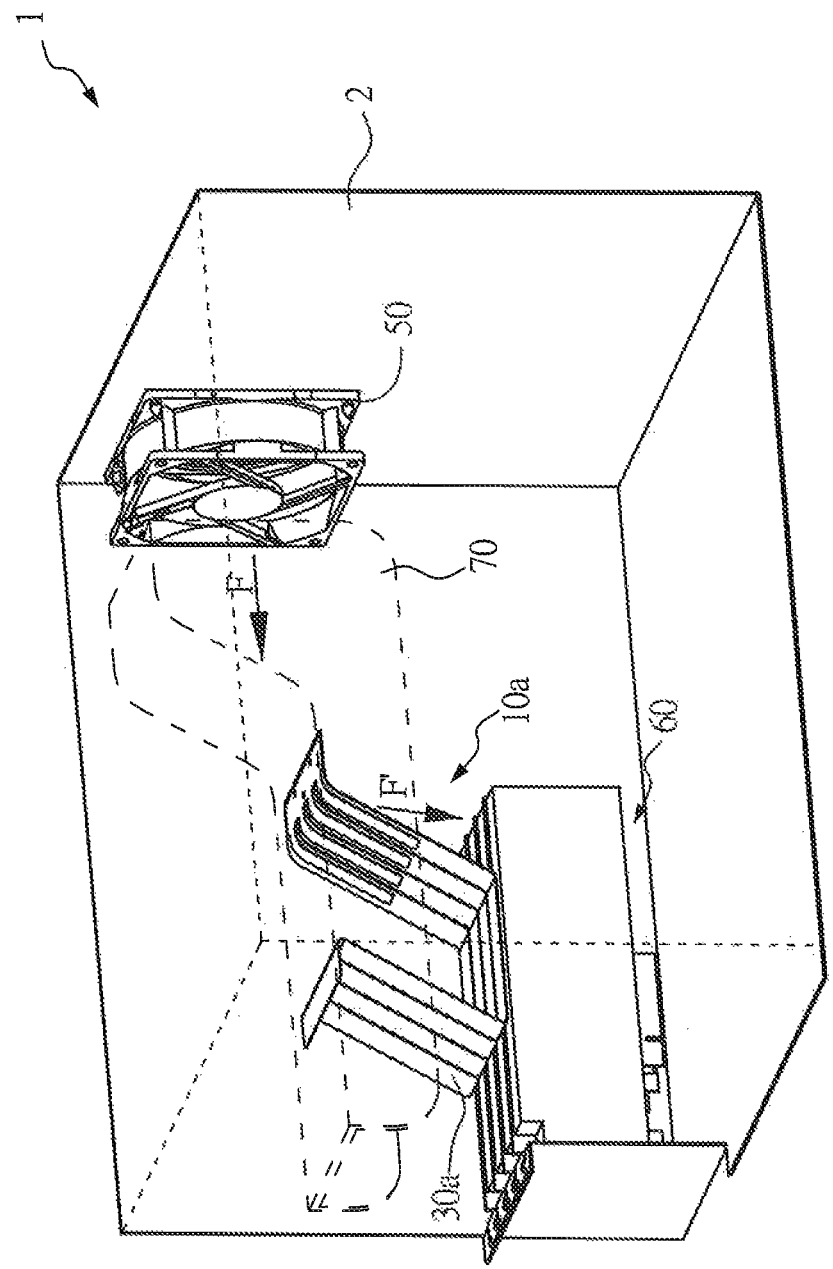

Please refer to FIG. 4A-4B, which illustrate schematic drawings of the deflection device applied to a computer device in the second embodiment of the present invention.

The deflection device 10a of the present invention is not limited to being fastened to the case 2 of the electronic device 1. In the second embodiment of the present invention, the electronic device 1 may have a wind scoop 70. The wind scoop 70 is located on the inlet of the fan device 50 so that the airflow generated by the fan device 50 can be more efficiently guided to the interface card 60. The deflection device 10a is connected to the inside of the wind scoop 70 and located on the interface card 60. The shape of the strip structure 30a of the deflection device 10a can also be changed according to different configurations of the interface cards 60. Since the shape of the deflection device 10a in the second embodiment is the same as the shape in the first embodiment, and the working method is the same, there is no need for further description.

Figure 5:
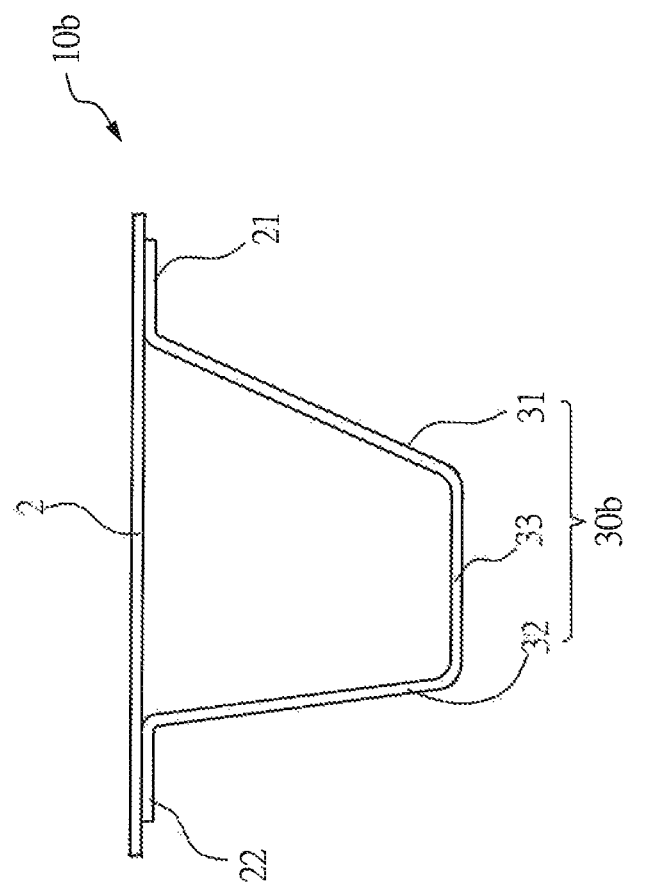
FIG. 5 illustrates a lateral view of the deflection device in the third embodiment of the present invention.

Please refer to FIG. 5, which illustrates a lateral view of the deflection device in the third embodiment of the present invention.

In the third embodiment of the present invention, the deflection device 10b also includes the first fixed part 21, the second fixed part 22, and the plurality of strip structures 30b. The plurality of strip structures 30b also include a first section 31, a second section 32, and a third section 33, but the first section 31, the second section 32, the third section 33, and a virtual plane where the first fixed part 21 and the second fixed part 22 are located form only a quadrilateral (such as a keystone) and do not form a parallelogram as in the first embodiment. Due to the shape, the deflection device 10b can still guide the airflow to different interface cards 60.

Please refer to FIG. 6, which illustrates a lateral view of the deflection device in the fourth embodiment of the present invention.

In the fourth embodiment of the present invention, the length of the third section 33 of each strip structure 30c of the deflection device 10c, for contacting the corresponding interface card 60, is reduced to form a transition structure that connects to the first section 31 and the second section 32, allowing a specific angle between the first section 31 and the second section 32 to be less than 180°. Thus, the first section 31, the second section 32, the third section 33, and the virtual plane where the first fixed part 21 and the second fixed part 22 are located together form a triangle. Due to the shape, the deflection device 10c still can guide the airflow to different interface cards 60, and the area of contact between the strip structure 30c and the interface card 60 is reduced.

Please refer to FIG. 7, which illustrates a lateral view of the deflection device in the fifth embodiment of the present invention.

The difference between the fifth embodiment and the abovementioned embodiment is that the third section 33 is an arc-shaped structure. Via the deflection device 10d, the airflow still can be guided to different interface cards 60. However, it will be obvious to people who have general knowledge of the art of the present invention that the third section 33 can also be other shapes, as long as the shape can achieve the object of the present invention: to contact to the interface card 60 and to connect to the first section 31 and the second section 32.

With the application of the abovementioned devices from deflection device 10a to 10d, the airflow generated by the fan device 50 can be guided to an interface card 60 of any size.

It is noted that the above-mentioned embodiments are only for illustration. It is intended that the present invention cover modifications and variations of this invention provided they fall within the scope of the following claims and their equivalents. Therefore, it will be apparent to those skilled in the art that various modifications and variations can be made to the structure of the present invention without departing from the scope or spirit of the invention.

What is claimed is:

1. A deflection device, located in an electronic device, for guiding an airflow generated by a fan device to at least one electronic component of the electronic device, the deflection device comprising:
    a first fixed part, for fixing the deflection device in a suitable position of the electronic device; and
    a plurality of strip structures, wherein one end of each of the strip structure is connected to the first fixed part, at least one part of any two adjacent strip structures is not connected to each other, allowing the strip structures to undergo compression deformation independently such that the strip structures form a first shape when not compressed or a second shape when compressed;
    when the deflection device is fixed in a suitable position of the electronic device and close to the electronic component, the shape of the at least one strip structure is changed from the first shape to the second shape due to contacting the electronic component for guiding the airflow to the electronic component wherein each of the plurality of strip structures comprises:
    a first section, wherein one end of the first section is connected to the first fixed part;
    a third section, wherein one end of the third section is connected to an end of the first section, for contacting the electronic component, causing the strip structure to form the second shape; and
    a second section, wherein one end a the second section is connected to an end of the third section.

2. The deflection device as claimed in claim 1, further comprising a second fixed part, wherein the second fixed part is connected to an end of the second section, and the second fixed part and the first fixed part are both fastened in a suitable position.

3. The deflection device as claimed in claim 1, wherein the first section faces an incoming direction of the airflow, and a wind angle is formed between the first section and the first fixed part along a direction which faces the incoming direction of the airflow.

4. The deflection device as claimed in claim 3, wherein the wind angle is larger than 90°, allowing the first section to be a tilted backwards shape relative to the first fixed part.

5. The deflection device as claimed in claim 1, wherein the first section is parallel to the second section.

6. The deflection device as claimed in claim 1, wherein the third section is a transition structure for connecting to the first section and the second section.

7. The deflection device as claimed in claim 1, wherein the third section is an arc-shaped structure for connecting to the first section and the second section.

8. The deflection device as claimed in claim 1, wherein the suitable position for fastening the first fixed part is a case of the electronic device.

9. The deflection device as claimed in claim 1, wherein the electronic device further comprises a wind scoop located in an inlet of the airflow of the fan device, and the suitable position for fastening the first fixed part is the wind scoop.

10. The deflection device as claimed in claim 1, wherein the plurality of strip structures are made of a deformable and elastically restored sheet-like material.

11. An electronic device, comprising:
    a fan device, for generating an airflow;
    at least one electronic component; and
    a deflection device, for guiding the airflow of the fan device to the at least one electronic component, the deflection device comprising:
    a first fixed part, for fixing the deflection device in a suitable position of the electronic device; and
    a plurality of strip structures, wherein one end of each of the strip structures is connected to the first fixed part, at least one part of any two adjacent strip structures is not connected to each other, allowing the strip structures to undergo compression deformation independently such that the strip structures form a first shape when not compressed or a second shape when compressed;
    when the deflection device is fixed in a suitable position of the electronic device and close to the electronic component, the shape of the at least one strip structure is changed from the first shape to the second shape due to contacting the electronic component for guiding the airflow to the electronic component, wherein each of the plurality of strip structures comprises:
    a first section, wherein one end of the first section is connected to the first fixed part;
    a third section, wherein one end of the third section is connected to an end of the first section for contacting the electronic component, allowing the strip structure form the second shape, and
    a second section, wherein one end of the second section is connected to an end of the third section.

12. The electronic device as claimed in claim 11, further comprising a second fixed part, wherein the second fixed part is connected to an end of the second section, and the second fixed part and the first fixed part are both fastened in a suitable position.

13. The electronic device as claimed in claim 11, wherein the first section faces an incoming direction of the airflow, and a wind angle is formed between the first section and the first fixed part along a direction which faces the incoming direction of the airflow.

14. The electronic device as claimed in claim 13, wherein the wind angle is larger than 90°, allowing the first section to be a tilted backwards shape relative to the first fixed part.

15. The electronic device as claimed in claim 11, wherein the first section is parallel to the second section.

16. The electronic device as claimed in claim 11, wherein the third section is a transition structure for connecting to the first section and the second section.

17. The electronic device as claimed in claim 11, wherein the third section is an arc-shaped structure for connecting to the first section and the second section.

18. The electronic device as claimed in claim 11, wherein the suitable position for fastening the first fixed part is a case of the electronic device.

19. The electronic device as claimed in claim 11, wherein the electronic device further comprises a wind scoop located in an inlet of the airflow of the fan device, and the suitable position for fastening the first fixed part is the wind scoop.

20. The electronic device as claimed in claim 11, wherein the plurality of strip structures are made of a deformable and elastically restored sheet-like material.

21. The electronic device as claimed in claim 11, wherein the electronic device is a computer system, and the electronic component is an interface card.

22. The electronic device as claimed in claim 21, wherein a width of each of the plurality of strip structures corresponds to a width of the at least one interface card.

\* \* \* \* \*